United States Patent [19]

Cerda

[11] Patent Number: 5,083,863
[45] Date of Patent: Jan. 28, 1992

[54] SYSTEM FOR CHECKING THE CONNECTION OF CONDUCTOR ELEMENTS IN A CONNECTOR, AND AN AUTOMATIC CONNECTION INSTALLATION EQUIPPED WITH SAID SYSTEM

[75] Inventor: Léon G. Cerda, Carry-le-Rouet, France

[73] Assignee: Societe Anonyme dite : Aerospatiale Societe Nationale Industrielle, Paris, France

[21] Appl. No.: 485,213

[22] Filed: Feb. 26, 1990

[30] Foreign Application Priority Data

Feb. 28, 1989 [FR] France .................... 89 02591

[51] Int. Cl.$^5$ .................... G01N 21/00; G01N 9/04
[52] U.S. Cl. .................... 356/237; 358/106; 250/223 R
[58] Field of Search ............ 356/237, 394, 73, 73.1, 356/240; 358/101, 106, 107, 239; 250/223 R, 572

[56] References Cited

U.S. PATENT DOCUMENTS

| | | | |
|---|---|---|---|
| 3,473,037 | 10/1969 | Schmermund | 250/223 R |
| 4,028,728 | 6/1977 | Sharp | 356/237 |
| 4,162,126 | 7/1979 | Nakagawa et al. | |
| 4,449,818 | 5/1984 | Yamaguchi et al. | 356/237 |
| 4,644,150 | 2/1987 | Kuga et al. | 356/237 |
| 4,688,939 | 8/1987 | Ray | 356/237 |
| 4,697,076 | 9/1987 | Yoshida | 356/240 |
| 4,727,637 | 3/1988 | Buckwitz et al. | |

FOREIGN PATENT DOCUMENTS 0194104 9/1986 European Pat. Off. .
2598858 11/1987 France .
2170962 8/1986 United Kingdom .

OTHER PUBLICATIONS

IBM Technical Disclosure Bulletin, "Dark-Field Inspection Tool for Semiconductor Devices", vol. 17 No. 4, Sep. 1974, Cook et al.

Primary Examiner—Richard A. Rosenberger
Assistant Examiner—Hoa Pham
Attorney, Agent, or Firm—Marshall, O'Toole, Gerstein, Murray & Bicknell

[57] ABSTRACT

A system is disclosed for checking the connection of first ends of electric conductors in the corresponding terminals of a connector having a rear face for introducing the ends of the conductors and a front face, each of the terminals being formed of a bore passing from one side to the other of the connector. This system further comprises, according to the invention, first illuminator for illuminating obliquely the front face of said connector, and electronic device for observing and displaying the front face, so that the variations of contrast on the front face of the connector make it possible to determine whether a particular conductor end is fitted into the appropriate terminal of the connector and whether the position of the conductor end is correct.

9 Claims, 6 Drawing Sheets

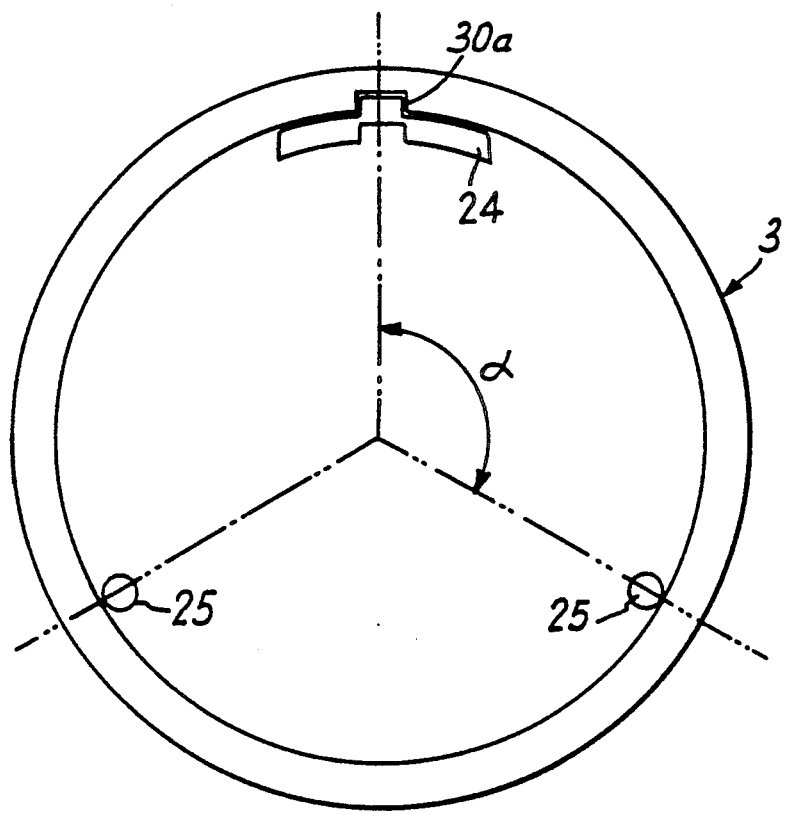
Fig:4a
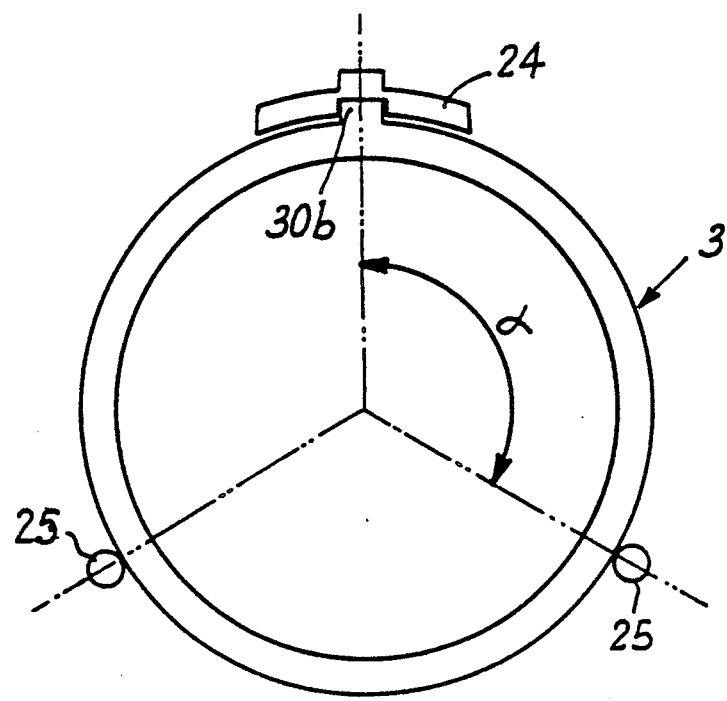
Fig:4b

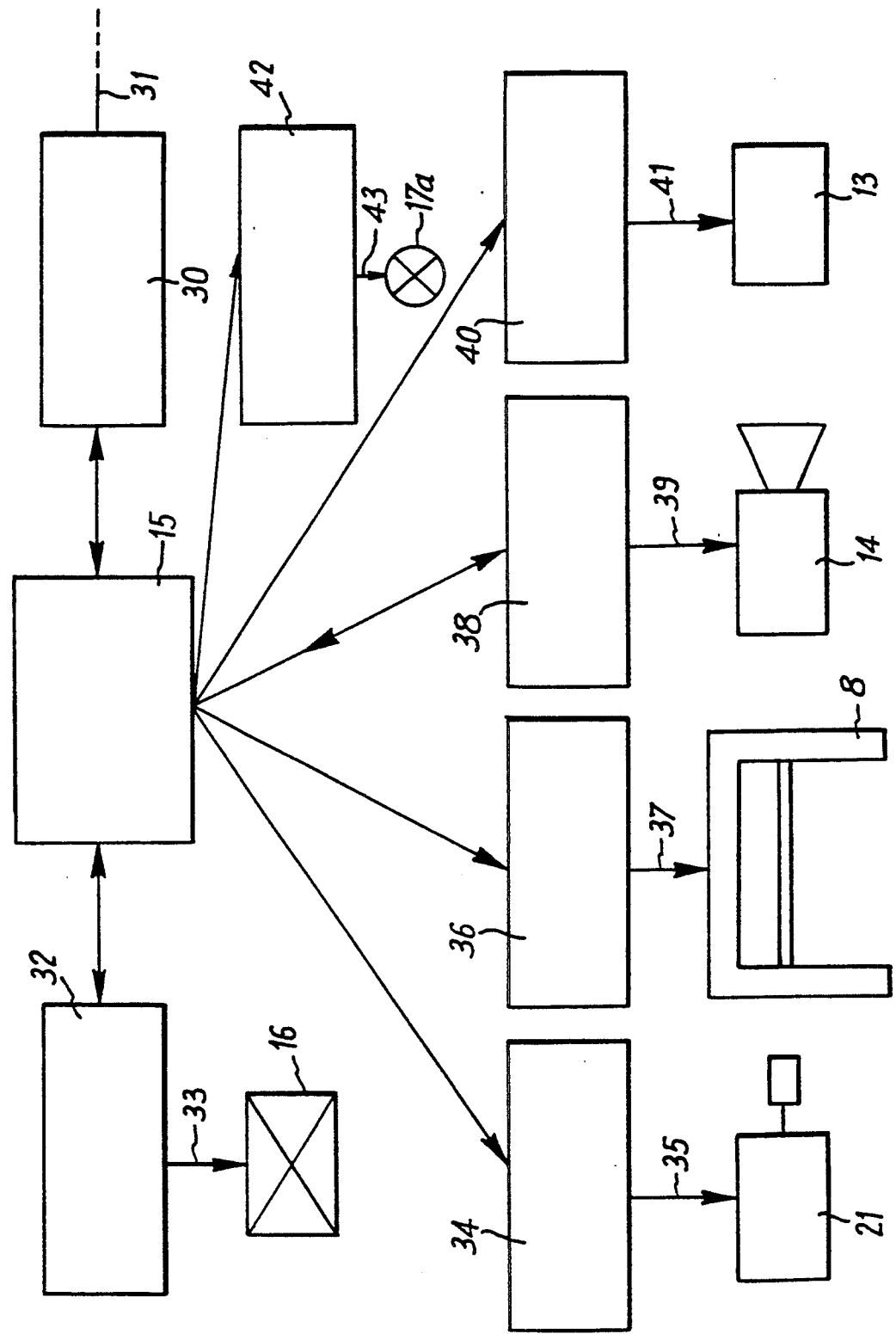

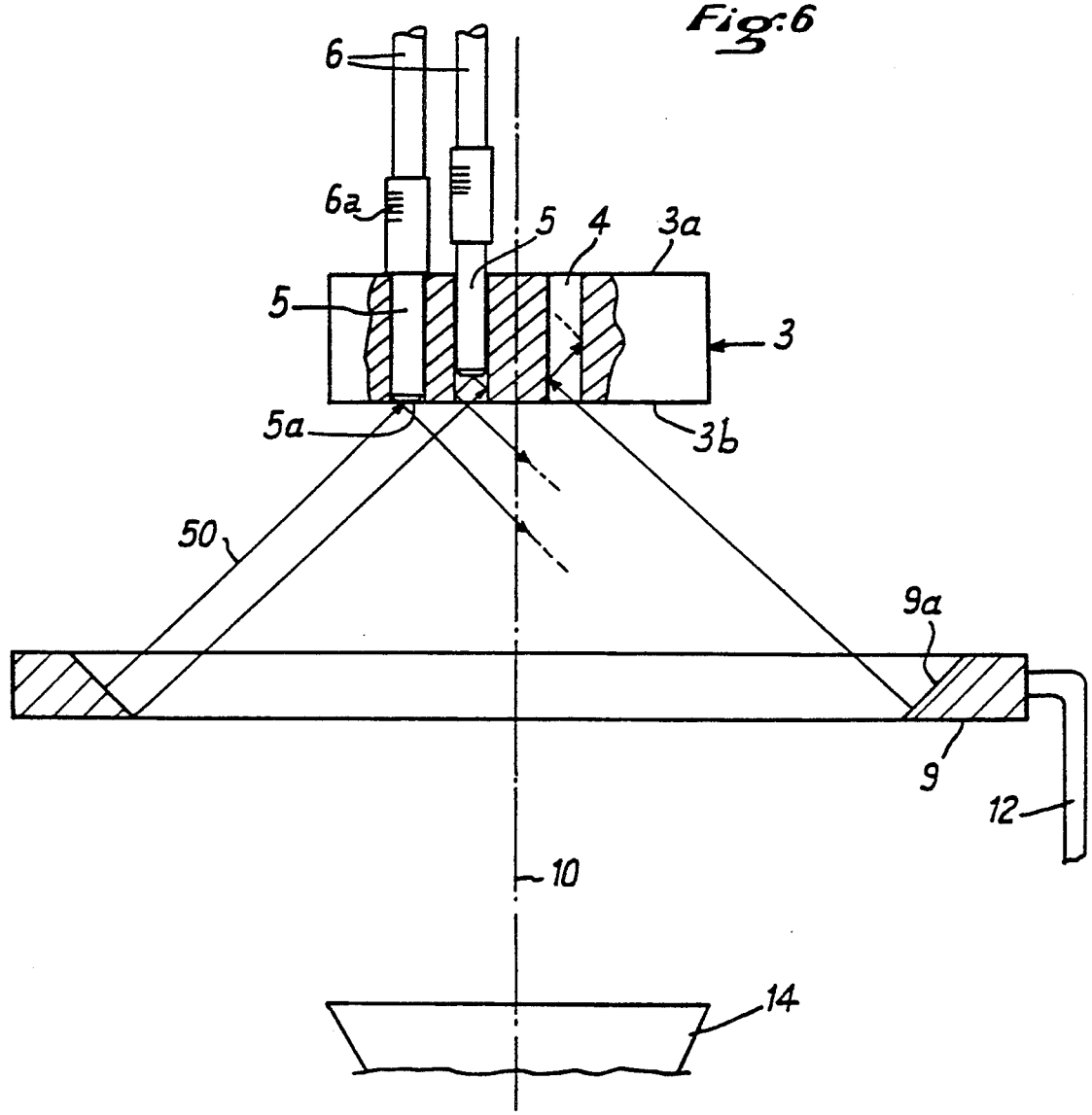
*Fig: 6*
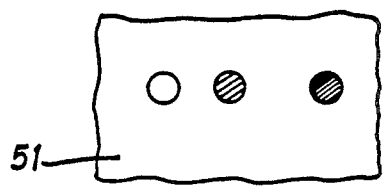
*Fig: 7*

SYSTEM FOR CHECKING THE CONNECTION OF CONDUCTOR ELEMENTS IN A CONNECTOR, AND AN AUTOMATIC CONNECTION INSTALLATION EQUIPPED WITH SAID SYSTEM

BACKGROUND OF THE INVENTION

The present invention relates to a system for checking the connection of the ends of electric conductors in the corresponding terminals of a connector, as well as an automatic connection installation comprising said system.

Generally, a connector has a plurality of terminals each formed of a bore passing from one side to the other through the connector, the end of the conductor to be connected being introduced through the rear face of the connector. For the connection to be correct, the end of the conductor must be fitted in the appropriate terminal and the end of the conductor must be fully inserted in said terminal. Up to now, such checking is carried out visually by the operator, which is a loss of time and a source of error since the accuracy of such checking depends in fact on the visual acuity of the operator and/or his degree of fatigue.

In this verification, the operator may be aided by directing a pinpoint light beam so that it passes through the terminal in which a given conductor is to be fitted. However, such sighting only delivers information of the "all or nothing" type, which makes it possible to determine whether a given conductor end is fitted into the appropriate terminal, but not that the connection is correct, i.e. as already mentioned that the end of the conductor is inserted fully in said terminal.

The present invention aims at overcoming these drawbacks.

SUMMARY OF THE INVENTION

The system for checking the connection of first ends of electric conductors in the corresponding terminals of a connector having a rear face for introducing said ends of the conductors and a front face, each of said terminals being formed of a bore passing from one side to the other of the connector, is remarkable, according to the invention, in that it comprises first illumination means for illuminating obliquely the front face of said connector, and electronic means for observing and displaying said front face, so that the variations of contrast on said front face of the connector make it possible to determine whether a particular conductor end is fitted into the appropriate terminal of the connector and whether the position of said conductor end is correct.

Thus, without any risk of error, it can be determined whether the connection of each of the conductors on the connector is correct and without a loss of time for the operator.

Advantageously, said first illumination means have a form of a ring or crown whose inner illumination face is slanted while being oriented towards the front face of the connector in the mounted position thereof.

Preferably, said observation means comprise a CCD (charge coupling diode) camera.

The present invention also relates to an automatic installation for connecting first ends of electric conductors in corresponding terminals of a connector, comprising a data processing control device, remarkable in that it comprises a system for checking the connection of said first ends such as defined above, controlled by said data processing device.

Advantageously, in order to further increase the reliability of said installation, it comprises means for mechanically holding and recognizing said connector.

In particular, said mechanical holding and recognition means may comprise several centering pins able to be moved radially with respect to said connector, at least one of said centering pins cooperating with an indexing means, of corresponding shape, provided on said connector.

Preferably, each of said centering pins is mounted at the free end of an arm whose other end is connected to a helical ramp provided on a rotatable support.

According to another characteristic of the invention, the installation may comprise second pinpoint illumination means able to move in a system of coordinates Ox, Oy, parallel to the front face of the connector so as to illuminate a pre-determined terminal thereof.

Advantageously, the installation comprises a bar code reader for identifying the electric conductors and/or a plurality of housings for grouping together the second ends of the electric conductors.

BRIEF DESCRIPTION OF THE DRAWINGS

The figures of the accompanying drawings will better show how the invention may be implemented.

FIGS. 4a and 4b show how the connector may be held in position by means of the holding means of FIG. 3;

FIG. 5 shows schematically the connections of the control microprocessor with the different elements of the installation of the invention;

FIG. 6 illustrates the use of oblique illumination means and means for observing the installation of the invention;

FIG. 7 is a detail of the display screen.

DESCRIPTION OF THE PREFERRED EMBODIMENTS

Figure 1:
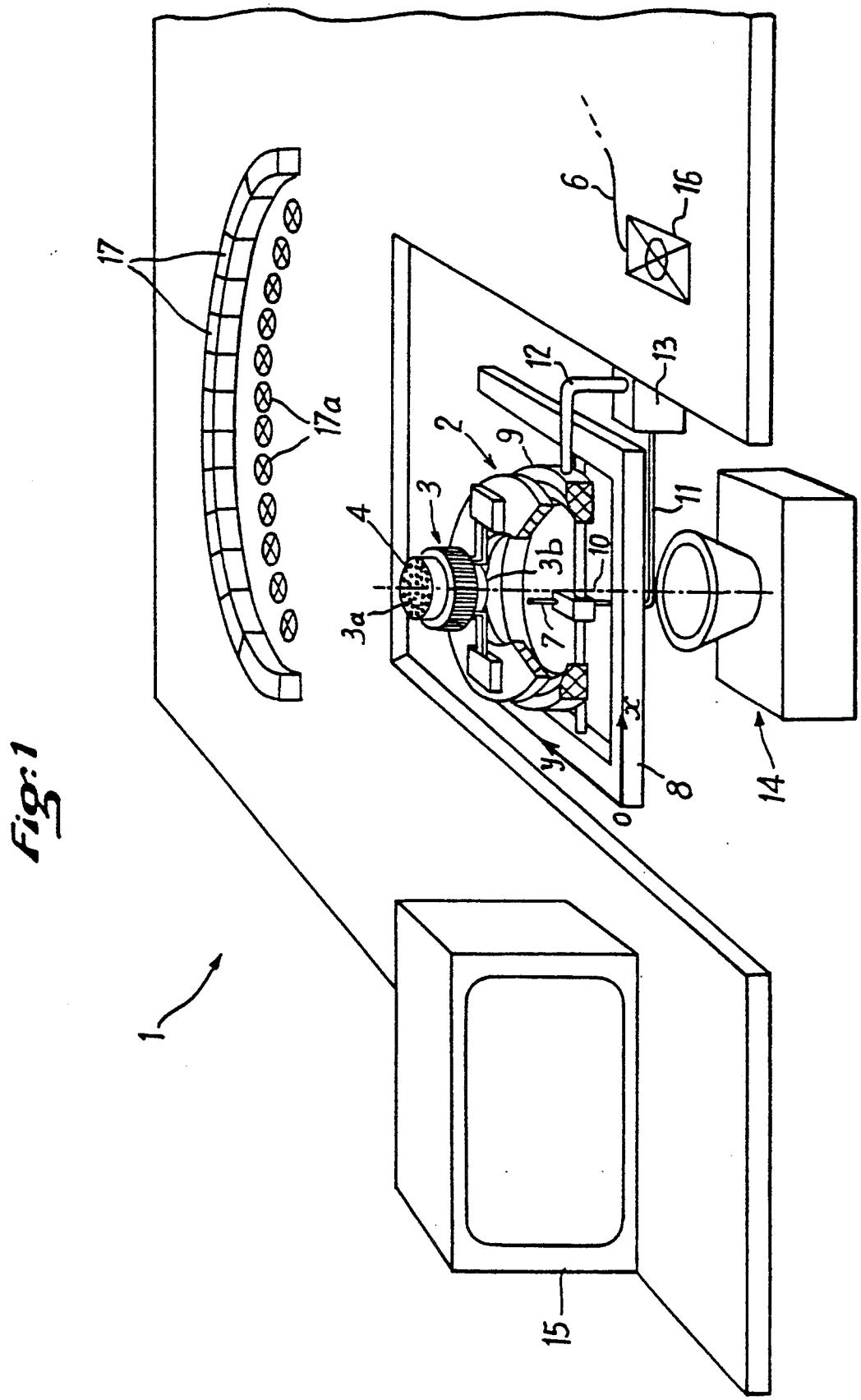
FIG. 1 is a schematic perspective view of the automatic connection installation of the invention comprising the connection checking system of the invention.

Referring to FIG. 1, the installation 2 of the invention comprises means 2 for mechanically holding and recognizing a connector 3 (round in this example) which will be described in detail hereafter. As can be best seen in FIG. 2, connector 3 comprises a plurality of terminals 4, each for the connection of the end 5 of an electric conductor 6 introduced through the rear face 3a of the connector 3.

Figure 2:
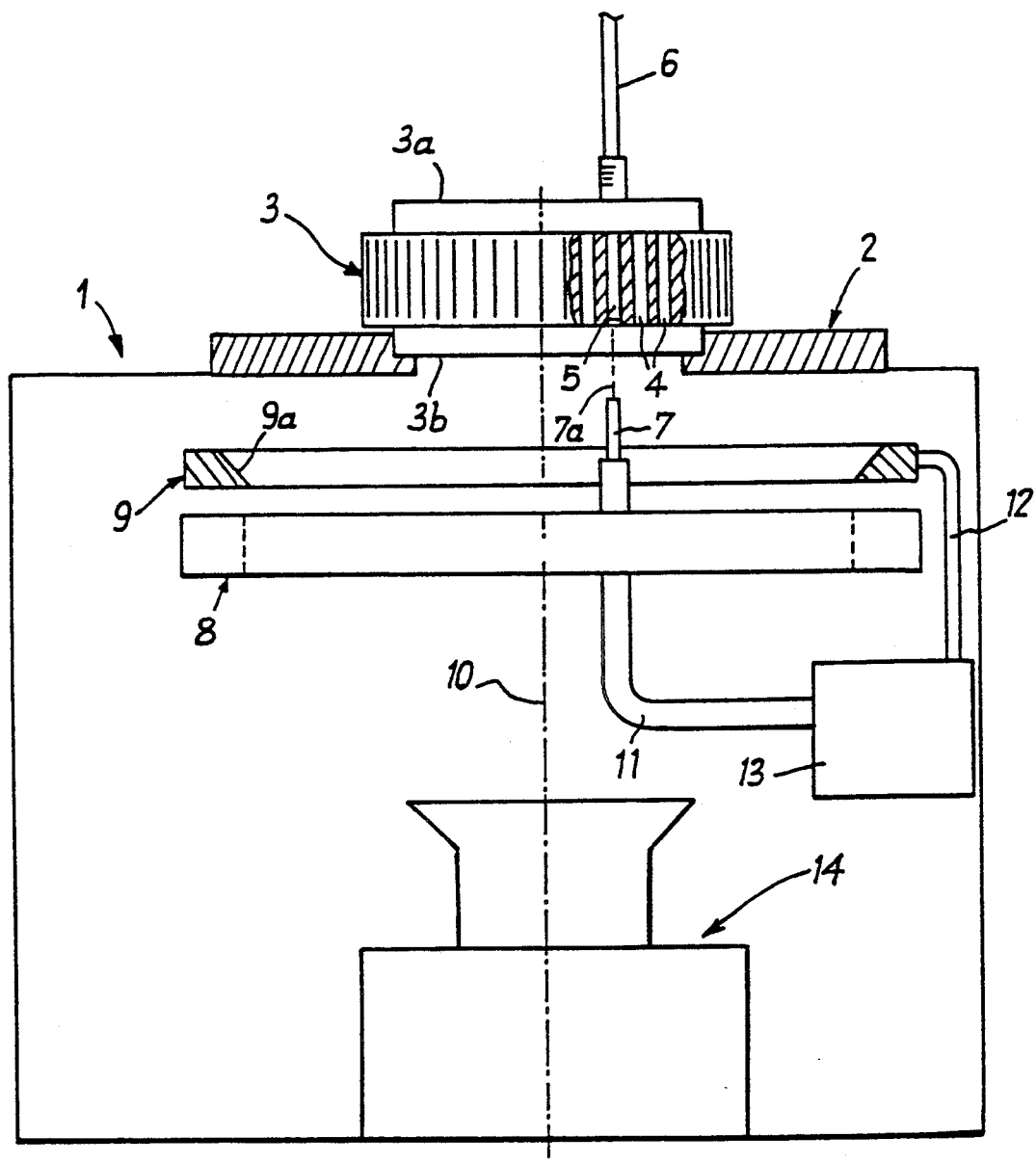
FIG. 2 is a side view in partial section, on a larger scale, of a portion of the installation of FIG. 1.

An optical fiber 7, mounted on a table 8 controlling the movement thereof in a system of orthogonal coordinates Ox, Oy, may move parallel to the front face 3b of connector 3 so as to illuminate a chosen terminal 4 in which the end 5 of the appropriate conductor 6 is to be inserted (FIG. 2).

Furthermore, means 9 are provided for obliquely illuminating the front face 3b of connector 3. These means 3 are in the form of a ring or crown coaxial with the central axis 10 of connector 3 in position in the installation 1, the illumination face 9a of ring 9, thereinside, being slanted in the direction of the front face 3b of connector 3.

The optical fiber 7 and ring 9 are connected by respective connections 11 and 12, to a variable intensity light generator 13.

Under the front face 3b of connector 3 there are further provided electronic means 14 for observing and displaying it, such for example as a CCD (charge coupling diode) camera.

The installation further comprises a bar code reader 16 for reading the code 6a of a particular conductor 6 and a plurality of conductor housings 17 identified by LEDs 17a for grouping together the ends, not connected on connector 3, of conductors 6 having the same destination.

The whole of the elements of the installation which have just been described is controlled by a microprocessor 15, in a way which will be described further on.

Figure 3:
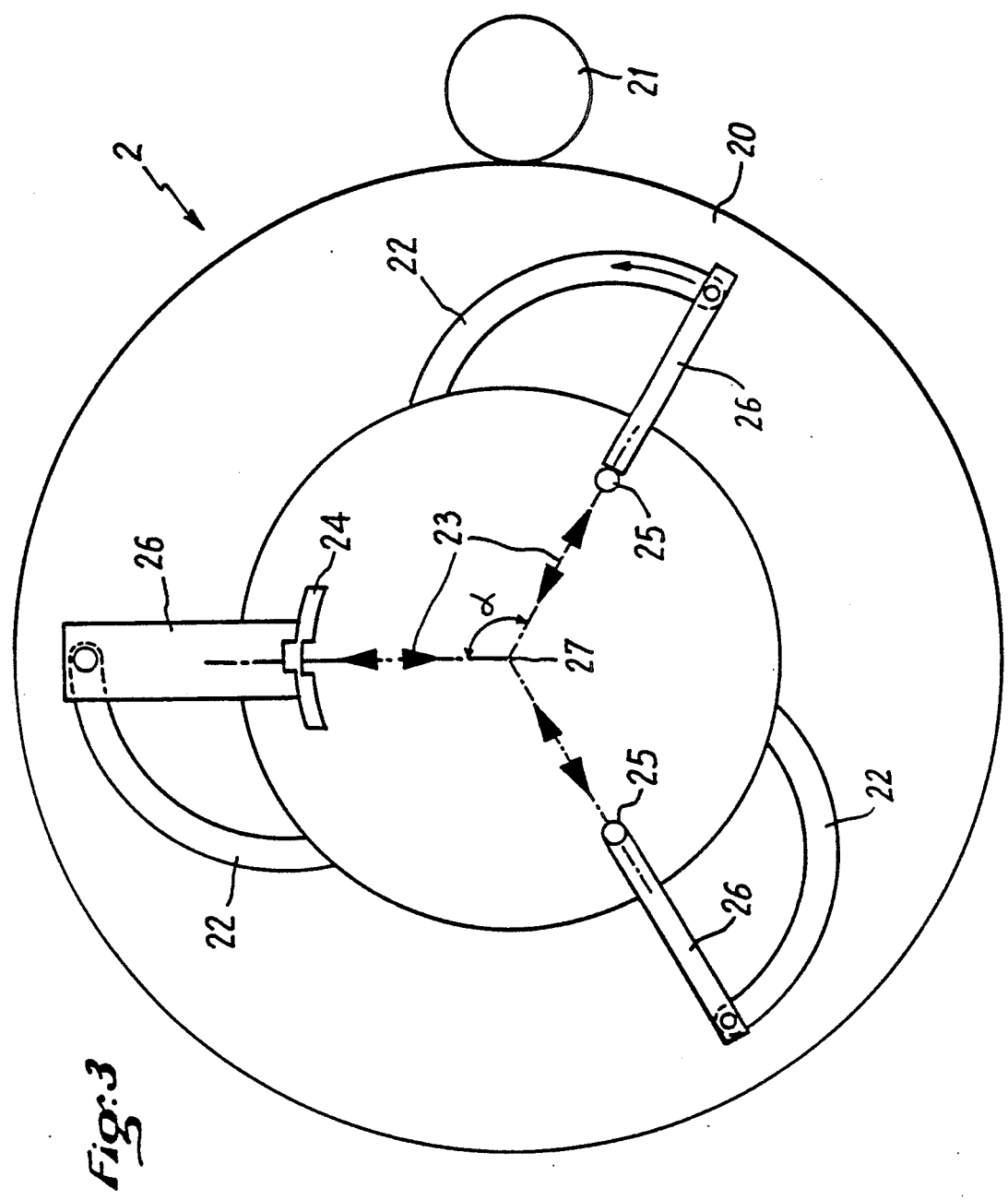
FIG. 3 is a schematic top view of the means for mechanically holding and recognizing the connector, and belonging to the installation of the invention.

As shown schematically in FIG. 3, the means 2 for mechanically holding and recognizing a connector comprise, in the case of a round connector, an annular support 20 which can be rotated about its axis 27 by a stepper motor 21. Support 20 has on its upper face helical ramps 22 (three in the case shown) for radially moving (as shown by the double arrows 23) an indexing pin 24 and two centering pins 25 of the connector, each carried at the free end of an arm 26 whose other end is connected to the corresponding ramp 22. Spur 24 and pins 25 are spaced apart at equal angles by an angle $\alpha = 120°$.

Depending on the type of round connector 3, two cases arise, as shown in FIGS. 4a and 4b. The indexing spur 24 and the centering pins 25 may be disposed inside the connector 3 (FIG. 4a), the indexing spur 24 then cooperating with a hollow member 30a of corresponding shape formed inside connector 3, or the indexing spur 24 and the centering pins 25 may be disposed outside the connector 3 (FIG. 4b), the indexing spur 24 in this case corresponding with a projecting member 30b of corresponding shape provided outside connector 3.

In the case of rectangular connectors, they may be fixed using a set of jaws, the connector also comprising in this case an indexing means.

Referring to FIG. 5, the microprocessor 15 is connected, by connection 31 and through the interface 30, to a central computer (not shown) containing the technical data bank. Furthermore, the microprocessor is connected:

by connection 33 and through the interface 32, to the bar code reader 16, by connection 35 and through the interface 34 to the stepper motor 21, by connection 37 and through the interface 36 to the table 8 for displacing the optical fiber, by connection 39 and through the interface 38 to the CCD camera 14, by connection 41 and through the interface 40 to the light generator 13, by connection 43 and through the interface 42 to the LEDs 17a.

The installation 1 of the present invention is used in the following way.

First of all, connector 3 is positioned by means of the mechanically holding and recognizing means 2. For this, depending on the type of connector 3 used, the microprocessor 15 controls the stepper motor 21 so as to cause support 20 to rotate and, thus, through the helical ramps 22 to move the indexing spur 24 and the centering pins 25 radially, in a controlled way, while adapting the position of spur 24 and pins 25 to the particular diameter of the connector.

The connector 3 is therefore firmly held in position, in an indexed way, and in addition these means 2 also play a role of recognizing the connector 3, in that the spur 24 and the pins 25 "measure" so to speak the diameter of the connector.

Once connector 3 has been positioned, each electric conductor 6 may be identified by reading its bar code by means of reader 16 connected to the microprocessor 15. This latter may then control the movement of the optical fiber 7 over table 8 so that the light beam 7a therefrom designates the terminal 4 of the connector 3 in which the end 5 of the conductor 6 which has just been identified is to be fitted, preferably by means of a specific tool. The end 5 is fitted through the rear face 3a of connector 3, opposite the front face 3b facing the optical fiber 7.

FIG. 6 illustrates the use of the means 9 for obliquely illuminating the front face 3b of connector 3 and of the observation means 14. The latter, comprising in particular a CCD camera, have several functions, checking the geometry of the connector positioned and the arrangements of its terminals, thus confirming that the connector positioned is indeed the one to be dealt with, automatically resetting the origin of the table for displacing the optical fiber, checking the fact that the end of the conductor is fitted in to the appropriate terminal, and that it has been done correctly.

The latter function will now be explained in greater detail, still referring to FIG. 6 (at this time of course the table 8 for moving the optical fiber 7 is in the rest position outside the field of camera 14).

The light beam 50, coming from the slanting annular face 9a of the illuminating ring 9, and oriented towards the front face 3b of connector 3, obliquely illuminates the latter and, in particular, the bores of terminals 4. As shown in FIG. 6, three cases may arise:

1) for all the terminals 4 (one of which is shown at the right in FIG. 6) in which one end 5 of an electric conductor 6 has not yet been fitted, the light is "trapped" in the bore, so that the latter appears dark for the camera 14, as shown in detail 51 of a display screen of FIG. 7, 2) if the end 5 of conductor 6 is perfectly fitted into terminal 4 (on the left of FIG. 6), the light 50 is reflected by the end face 5a of conductor 6 and the "bore" appears light on the screen 51, 3) in the case where the end 5 of conductor 6 is not correctly fitted into terminal 4 (in the middle in FIG. 6), the bore has, for camera 14, a certain grey tint depending on whether end 5 is fitted more or less deeply into terminal 4.

Thus, contrast variations observed by the camera 14 and read from the screen 51 make it possible to determine which terminal(s) is/are fitted with a conductor and whether the fitting for each of the terminal is correct.

In addition, the unconnected ends of conductors 6 may be grouped together, as a function of their destination, in housings 17 each identified by a LED 17a, the diodes being controlled by the microprocessor 15.

What is claimed is:

1. A system for checking the connection of first ends of electric conductors in the corresponding terminals of a connector having a rear face for introducing said ends of the conductors and a front face, each of said terminals being formed of a bore passing from one side to the other of the connector, which system further comprises a first illumination means for illuminating obliquely the front face of said connector, said first illumination means having a form of a ring whose inner illumination face is slanted while being oriented towards the front face of the connector in the mounted position thereof, and electronic means for observing and displaying said front face, so that the variations of contrast on said front face of the connector make it possible to determine whether a particular conductor end is fitted into the appropriate terminal of the connector and whether the position of said conductor end is correct.

2. The system as claimed in claim 1, wherein said observation means comprise a CCD (charge coupling diode) camera.

3. An installation for the automatic connection of first ends of electric conductors in corresponding terminals of a connector, comprising a data processing control device, further comprising a system for checking the connection of said first ends as claimed in claim 1, controlled by said data processing device.

4. The installation as claimed in claim 3, comprising means for mechanically holding and recognizing said connector.

5. The installation as claimed in claim 4, wherein said mechanical holding and recognition means comprise several centering pins able to be moved radially with respect to said connector, at least one of said centering pins cooperating with an indexing member, of corresponding shape, provided on said connector.

6. The installation as claimed in claim 5, wherein each of said centering pins is mounted at the free end of an arm whose other end is connected to a helical ramp provided on a rotatable support.

7. The installation as claimed in claim 3, comprising second pinpoint illumination means able to move in a system of coordinates Ox, Oy, parallel to the front face of the connector in order to illuminate a predetermined terminal thereof.

8. The installation as claimed in claim 3, further comprising a bar code reader for identifying the electric conductors.

9. The installation as claimed in claim 3, further comprising a plurality of housings for grouping together the second ends of the electric conductors.

* * * * *